United States Patent
Miyashita et al.

(10) Patent No.: US 11,104,997 B2
(45) Date of Patent: Aug. 31, 2021

(54) SUBSTRATE PROCESSING APPARATUS AND METHOD OF MANUFACTURING SEMICONDUCTOR DEVICE

(71) Applicant: Kokusai Electric Corporation, Tokyo (JP)

(72) Inventors: Naoya Miyashita, Toyama (JP); Tomoshi Taniyama, Toyama (JP)

(73) Assignee: Kokusai Electric Corporation, Tokyo (JP)

( * ) Notice: Subject to any disclaimer, the term of this patent is extended or adjusted under 35 U.S.C. 154(b) by 0 days.

(21) Appl. No.: 16/560,598

(22) Filed: Sep. 4, 2019

(65) Prior Publication Data

US 2020/0123659 A1   Apr. 23, 2020

(30) Foreign Application Priority Data

Oct. 19, 2018   (JP) .............................. JP2018-197452

(51) Int. Cl.
*C23C 16/52*   (2006.01)
*H01L 21/02*   (2006.01)
(Continued)

(52) U.S. Cl.
CPC .......... *C23C 16/52* (2013.01); *C23C 16/4412* (2013.01); *C23C 16/46* (2013.01);
(Continued)

(58) Field of Classification Search
CPC ..... C23C 16/52; C23C 16/46; C23C 16/4412; C23C 16/45546; H01L 21/0217;
(Continued)

(56) References Cited

U.S. PATENT DOCUMENTS 6,289,737 B1 * 9/2001 Kouketsu ............. G05D 16/024
                                                                73/714
2006/0097644 A1   5/2006 Kono et al.
(Continued)

FOREIGN PATENT DOCUMENTS

JP        62-47719 A      3/1987
JP        06-266446 A     9/1994
(Continued)

*Primary Examiner* — Julia Slutsker
(74) *Attorney, Agent, or Firm* — Edell, Shapiro & Finnan, LLC (57) ABSTRACT

Described herein is a technique capable of substantially cancelling out a machine difference of a pressure control valve. According to one aspect of the technique of the present disclosure, there is provided a substrate processing apparatus including: a sensor detecting a valve opening degree; a first control circuit outputting a valve opening degree control signal based on a valve opening degree value detected by the sensor and a deviation between a pressure of the process chamber and a target vacuum pressure value; a second control circuit outputting an electropneumatic control signal based on the valve opening degree control signal; and a span adjustment circuit adjusting the first or second control circuit so that an upper limit value of the valve opening degree is set to a predetermined full opening degree less than a physically defined full opening degree.

9 Claims, 7 Drawing Sheets (51) Int. Cl.
　　　*C23C 16/46*　　　(2006.01)
　　　*H01L 21/673*　　(2006.01)
　　　*C23C 16/44*　　　(2006.01)

(52) U.S. Cl.
　　　CPC .... *H01L 21/0217* (2013.01); *H01L 21/02271* (2013.01); *H01L 21/67313* (2013.01)

(58) Field of Classification Search
　　　CPC ......... H01L 21/67313; H01L 21/02271; H01L 21/0228; H01L 21/02211; H01L 21/67017; H01L 21/67109; H01L 21/67253; H01L 21/6719; G05D 16/024; G05D 16/2097; F16K 51/02; F16K 31/122
　　　See application file for complete search history.

(56) References Cited

U.S. PATENT DOCUMENTS

| | | | |
|---|---|---|---|
| 2011/0174380 A1 | 7/2011 | Itafuji et al. | |
| 2017/0351275 A1* | 12/2017 | Ito | G05D 16/2053 |
| 2018/0142357 A1* | 5/2018 | Furusawa | C23C 16/4408 |
| 2019/0390339 A1* | 12/2019 | Malinen | C23C 16/4409 |

FOREIGN PATENT DOCUMENTS

| | | |
|---|---|---|
| JP | 2008-69787 A | 3/2008 |
| JP | 2011-166101 A | 8/2011 |
| JP | 201845432 A | 3/2018 |
| WO | 2004109420 A1 | 12/2004 |

\* cited by examiner

SUBSTRATE PROCESSING APPARATUS AND METHOD OF MANUFACTURING SEMICONDUCTOR DEVICE

CROSS REFERENCE TO RELATED APPLICATIONS

This application claims foreign priority under 35 U.S.C. § 119(a)-(d) to Application No. JP 2018-197452 filed on Oct. 19, 2018, the entire contents of which are hereby incorporated by reference.

TECHNICAL FIELD

The present disclosure relates to a substrate processing apparatus and a method of manufacturing a semiconductor device.

BACKGROUND

In manufacturing processes of a semiconductor device, a substrate processing apparatus such as a vertical type substrate processing apparatus may be used for performing a process such as a film-forming process and a modifying process on a substrate under a predetermined temperature and a predetermined atmosphere. For example, in the vertical type substrate processing apparatus, in order to perform the process such as the film-forming process, a predetermined number of substrates are charged (transferred) into a substrate retainer such that the substrates are arranged in a vertical direction in the substrate retainer, the substrate retainer charged with the substrates is loaded (transferred) into a process chamber, and a process gas is supplied into the process chamber while the substrates are heated by a furnace heater installed around the process chamber. Thereby, the process is performed on the substrates.

A gas inside the process chamber of the substrate processing apparatus is exhausted by a vacuum pump. A pressure control valve is provided (installed) between the process chamber and the vacuum pump, and an opening degree of the pressure control valve is continuously adjusted to maintain an inner pressure of the process chamber at a predetermined pressure. According to related arts, the pressure control valve or a pressure control system capable of controlling a vacuum pressure of a vacuum vessel such as the process chamber of the substrate processing apparatus is disclosed.

In recent years, the process such as the film-forming process is often performed by using a method in which a plurality of types of gases is cyclically and repeatedly supplied onto the substrate and the gases chemically react with each other on the substrate. When the process is performed, in order to maintain the inner pressure of the process chamber constant while supplying at least one of the gases, it may be necessary to delicately control a squeeze amount of a packing of a valve element. In addition, it is preferable for different gases to be quickly discharged without being mixed in the process chamber. Therefore, before a new gas is supplied into the process chamber, the gas inside the process chamber may be exhausted with a maximum exhaust rate (that is, with the opening degree of the pressure control valve adjusted to a maximum opening degree). Accordingly, the inner pressure of the process chamber may fluctuate (change) greatly during the film-forming process. In addition, when switching between a maximum exhaust operation (in which the gas is exhausted with the maximum exhaust rate) and a constant pressure operation (in which the gas is exhausted while maintaining the inner pressure of the process chamber constant), a constant rate control capable of limiting a pressure change rate may be required.

In addition, when a mechanical error of the maximum opening degree is different between pressure control valves, it is difficult to reproduce (perform) the same film-forming process by two or more apparatuses. Hereinafter, a difference in mechanical error of parameter such as the maximum opening degree of the pressure control valve, which exists between pressure control valves, is simply referred to as a "machine difference".

SUMMARY

Described herein is a technique capable of substantially cancelling out a machine difference of a pressure control valve and easily reproducing the same process.

According to one aspect of the technique of the present disclosure, there is provided a substrate processing apparatus including: a process chamber in which a substrate is processed; a vacuum pump configured to exhaust the process chamber; a valve body including: a flow path connecting the process chamber and the vacuum pump; and a valve seat provided at the flow path; a cylinder connected to the valve body and configured to accommodate a piston movably in a predetermined axial direction; a valve element connected to the piston and configured to move away from the valve seat by closing the flow path by being brought into contact with the valve seat or by opening the flow path according to a valve opening degree; a sensor configured to detect the valve opening degree; a valve controller configured to control the valve opening degree, wherein the valve controller includes: a first control circuit configured to output a valve opening degree control signal of controlling the valve opening degree based on a valve opening degree value detected by the sensor and a deviation between a pressure of the process chamber and a target vacuum pressure value; a second control circuit configured to output an electropneumatic control signal of controlling supply of an operation fluid to the piston based on the valve opening degree control signal; and a span adjustment circuit configured to adjust the first control circuit or the second control circuit so that an upper limit value of the valve opening degree is set to a predetermined full opening degree less than a physically defined full opening degree.

Other problems of the related arts and novel features of the technique described herein will become apparent from the descriptions of the present specification and the accompanying drawings.

DETAILED DESCRIPTION

Embodiments

Hereinafter, one or more embodiments (hereinafter, simply referred to as "embodiments") according to the technique of the present disclosure will be described with reference to the drawings. Specifically, a substrate processing apparatus according to the embodiments, a vacuum pressure control system used in the substrate processing apparatus and a method of manufacturing a semiconductor device using the substrate processing apparatus will be sequentially described in detail.

Configuration of Substrate Processing Apparatus

Figure 1:
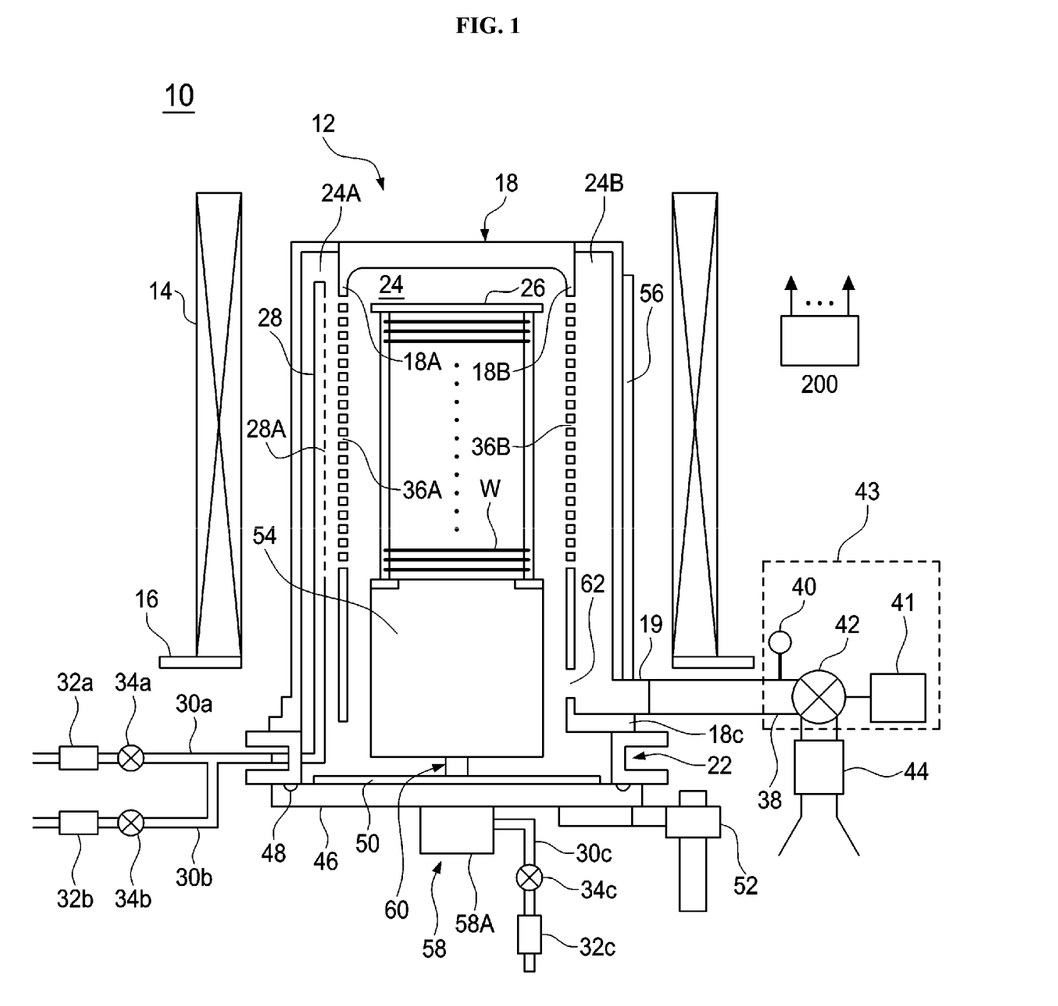
FIG. 1 schematically illustrates a vertical cross-section of a substrate processing apparatus according to one or more embodiments described herein.

As shown in FIG. 1, a substrate processing apparatus 10 is configured as a vertical type heat treatment apparatus (also referred to as a "batch type vertical furnace apparatus") capable of performing a heat treatment process in manufacturing processes of an integrated circuit (IC). The substrate processing apparatus 10 includes a process furnace 12.

The process furnace 12 includes a heater 14 serving as a heating device (also referred to as a "heating mechanism"). The heater 14 is of a cylindrical shape, and is vertically installed while being supported by a heater base 16 serving as a support plate. The heater 14 also functions as an activation mechanism (also referred to as an "excitation mechanism") for activating (exciting) a gas such as a process gas described later by heat as described later.

A reaction tube 18 is provided in an inner side of the heater 14. A vacuum vessel (also referred to as a "process vessel") is constituted by the reaction tube 18. For example, the reaction tube 18 is made of a heat resistant material such as quartz ($SiO_2$). The reaction tube 18 is of a cylindrical shape with an open lower end and a closed upper end. A flange portion 18C protruding outward from an outer periphery of the reaction tube 18 is provided at a lower end opening of the reaction tube 18. The flange portion 18C of the reaction tube 18 is made of a metal, and is supported by a manifold 22 of a cylindrical shape. A process chamber 24 is constituted by a hollow cylindrical portion of the reaction tube 18. The process chamber 24 is configured to accommodate a plurality of wafers including a wafer W serving as a substrate along an axial direction of the reaction tube 203 (that is, a vertical direction) in a horizontal orientation in a multistage manner by a boat 26 described later. A space in which the plurality of the wafers including the wafer W supported by the boat 26 is accommodated is referred to as a process region, and a space below the process region is referred to as a heat insulating region.

A supply buffer 24A and an exhaust buffer 24B are provided on an outer wall of the reaction tube 18 at positions facing each other. Protruding portions of the supply buffer 24A and the exhaust buffer 24B constitute the outer wall of the reaction tube 18, and portions of the reaction tube 18 of a cylindrical shape covered by the supply buffer 24A and the exhaust buffer 24B are configured as a partition portion 18A and a partition portion 18B, respectively. In other words, a gas supply space provided in the supply buffer 24A is defined by the outer wall of the reaction tube 18 and the partition portion 18A. A lower end of the supply buffer 24A is opened to inside the process chamber, whereas a lower end of the exhaust buffer 24B is closed by the flange portion 18C. Therefore, a gas exhaust space of the exhaust buffer 24B is defined by the outer wall of the reaction tube 18, the partition portion 18B and the flange portion 18C.

A plurality of gas supply ports 36A configured to fluidically communicate with the process chamber 24 and the gas supply space is provided at the partition portion 18A. The plurality of the gas supply ports 36A has a shape of a horizontally elongated slit, and is provided at the same interval as that between the plurality of the wafers including the wafer W in a manner corresponding to the plurality of the wafers in the process region. That is, the plurality of the gas supply ports 36A is provided to face side ends of the plurality of the wafers.

A plurality of gas exhaust ports serving as a first exhaust port 36B configured to fluidically communicate with the process chamber 24 and the gas exhaust space is provided at the partition portion 18B. The plurality of the gas exhaust ports serving as the first exhaust port 36B is of a shape of a horizontally elongated slit, and is provided at the same interval as that between the plurality of the wafers including the wafer W in a manner corresponding to the plurality of the wafers in the process region. For example, each of the plurality of the gas exhaust ports serving as the first exhaust port 36B may be provided at the same height as each of the plurality of the gas supply ports 36A so as to face each of the plurality of the gas supply ports 36A. Alternatively, instead of the plurality of the gas exhaust ports, the first gas exhaust port 36B may be embodied by a single gas exhaust port opened vertically so as to face each of the plurality of the wafers including the wafer W in the process region. According to the embodiments, the first exhaust port 36B is provided to face the side ends of the plurality of the wafers.

A sub exhaust port 62 serving as a second exhaust port (also referred to as a "second exhaust part") is provided below the first exhaust port 36B of the partition portion 18B. The sub exhaust port 62 may be provided in the heat insulating region, or may be provided at a position facing a heat insulating part 54 which will be described later. The sub exhaust port 62 is of a shape of a horizontally elongated rectangle. An opening area of the sub exhaust port 62 is greater than an opening area of one of the plurality of the gas exhaust ports serving as the first exhaust port 36B and smaller than a total opening area of the plurality of the gas exhaust ports serving as the first exhaust port 36B. The gas exhaust port 36B and the sub exhaust port 62 are configured to communicate with the process chamber 24 and the exhaust buffer 24B, and are configured to exhaust an atmosphere of the heat insulating region in the process chamber 24. By providing the sub exhaust port 62 in the heat insulating region, it is possible to suppress the diffusion of a purge gas flowing around the heat insulating part 54 into the process region, and it is also possible to suppress the deterioration of a film-forming uniformity due to the dilution of the process gas in the process region. In the present specification, the term "process gas" may indicate only a first process gas which will be described later, only a second process gas which will be described later, both of the first process gas and the second process gas, or three or more gases.

A nozzle 28 may be provided in the gas supply space of the supply buffer 24A. For example, the nozzle 28 is made of a heat resistant material such as quartz. A gas supply pipe 30a is connected to the nozzle 28. A mass flow controller (MFC) 32a serving as a flow rate controller (flow rate control mechanism) and a valve 34a serving as an opening/closing valve are sequentially provided at the gas supply pipe 30a from an upstream side toward a downstream side of the gas supply pipe 30a. A gas supply pipe 30b configured to supply an inert gas is connected to the gas supply pipe 30a at a downstream side of the valve 34a. A mass flow controller (MFC) 32b and a valve 34b are sequentially provided at the gas supply pipe 30b from an upstream side toward a downstream side of the gas supply pipe 30b. A process gas supply mechanism (also referred to as a "process gas supply system") is constituted mainly by the gas supply pipe 30a, the MFC 32a and the valve 34a. An inert gas supply mechanism (also referred to as an "inert gas supply system") is constituted mainly by the gas supply pipe 30b, the MFC 32b and the valve 34b. In addition, the process gas supply mechanism may further include the gas supply pipe 30b, the MFC 32b and the valve 34b. When a plurality of nozzles including the nozzle 28 is provided, a plurality of process gas supply mechanisms including the process gas supply mechanism and a plurality of inert gas supply mechanisms including the inert gas supply mechanism may be provided corresponding to the plurality of the nozzles including the nozzle 28.

The nozzle 28 is provided (installed) in the gas supply space of the supply buffer 24A, and extends from a lower portion of the reaction tube 203 to an upper portion of the reaction tube 203 along a stacking direction of the plurality of the wafers including the wafer W. The nozzle 28 is provided beside the plurality of wafers in parallel to the stacking direction of the plurality of the wafers. The nozzle 28 according to the embodiments may include an L-shaped nozzle. A short horizontal portion of the nozzle 28 is installed through a side wall of the manifold 22. A plurality of gas ejection holes 28A is provide at a side surface of a long vertical portion of the nozzle 28 so as to supply the gas such as the process gas to the entirety of at least an wafer arrangement region where the plurality of the wafers including the wafer W is arranged. The plurality of the gas ejection holes 28A may be opened to face a center of the reaction tube 18 at the same interval as an arrangement interval between the plurality of the wafers. As a result, it is possible to supply the gas such as the process gas toward each of the plurality of the wafers including the W along a straight path from the plurality of the gas ejection holes 28A to each of the plurality of the wafers via the plurality of the gas supply ports 36A.

An exhaust port 19 communicating with the gas exhaust space is provided at a lower end of the exhaust buffer 24B. An exhaust pipe 38 configured to exhaust an inner atmosphere of the process chamber 24 is connected to the exhaust port 19. A vacuum pump 44 serving as a vacuum exhaust device is connected to the exhaust pipe 38 via a vacuum gauge 40 configured to detect an inner pressure of the process chamber 24 and an APC (Automatic Pressure Controller) valve 42. The vacuum gauge 40 serves as a pressure detector (also referred to as a "pressure detecting mechanism") and the APC valve 42 serves as an opening/closing valve.

An opening degree of the APC valve 42 is controlled by a valve controller 41. With the vacuum pump 44 in operation, the APC valve 42 may be opened or closed to vacuum-exhaust the process chamber 24 or stop the vacuum exhaust. With the vacuum pump 44 in operation, the opening degree of the APC valve 42 may be adjusted based on pressure information detected by the vacuum gauge 40, in order to control (adjust) the inner pressure of the process chamber 24 to a target value (that is, a target pressure). A vacuum pressure control system 43 is constituted mainly by vacuum gauge 40, the valve controller 41 and the APC valve 42.

A seal cap 46 serving as a furnace opening cover capable of airtightly sealing a lower end opening of the manifold 22 is provided under the manifold 22. The seal cap 46 is made of a metal, and is of a disk shape. An O-ring 48 serving as a sealing part (also referred to as a "sealing member") is provided on an upper surface of the seal cap 46 so as to be in contact with a lower end of the manifold 22. In addition, a seal cap plate 50 configured to cover and protect the seal cap 46 is installed on the upper surface of the seal cap 46 in a region inner than the O-ring 48.

The seal cap 46 is in contact with the lower end of the manifold 22 from thereunder. The seal cap 46 may be moved upward or downward in the vertical direction by a boat elevator 52 provided outside the reaction tube 18 vertically. The boat elevator 52 serves as an elevating mechanism. The boat elevator 52 also serves as a transfer device (transfer mechanism) that loads (transfers) the boat 26 and the plurality of the wafers including the wafer W accommodated in the boat 26 into the process chamber 24 or unloads (transfers) the boat 26 and the plurality of the wafers including the wafer W accommodated in the boat 26 out of the process chamber 24.

The boat 26 serving as a substrate retainer is configured to accommodate (support) the plurality of the wafers including the wafer W (for example, 25 to 200 wafers). In the boat 26, the plurality of the wafers is horizontally oriented with a predetermined interval therebetween. That is, the plurality of the wafers is supported by the boat 26 with their centers aligned with each other. For example, the boat 26 is made of a heat resistant material such as quartz and SiC.

The heat insulating part (also referred to as a "heat insulating portion") 54 is provided between the boat 26 and the seal cap 46. That is, the heat insulating part 54 is provided below the boat 26. For example, the heat insulating part 54 may be of a cylindrical shape, or may be embodied by insulating plates (not shown) of a disk shape arranged in multiple stages vertically. The boat 26 and the heat insulating part 54 are accommodated in a cylindrical space constituted by the process chamber 24.

A temperature detector 56 serving as a temperature detection mechanism is provided in the reaction tube 18 along the outer wall of the reaction tube 18. The state of electric conduction to the heater 14 is adjusted based on temperature information detected by the temperature detector 56, such that an inner temperature of the process chamber 24 has a desired temperature distribution.

A rotating shaft 60 configured to rotate the boat 26 of a cylindrical shape is fixed to a lower portion of the heat insulating part 54. Under the rotating shaft 60, a rotating mechanism 58 configured to rotate the boat 26 is provided (installed) at the seal cap 46 opposite to the process chamber 24.

The rotation mechanism 58 includes a housing 58A. The housing 58A is of a cylindrical shape with an open upper end and a closed lower end. A gas supply pipe 30c is connected to the housing 58A. A mass flow controller (MFC) 32c and a valve 34c are sequentially provided at the gas supply pipe 30c from an upstream side toward a downstream side of the gas supply pipe 30c. A purge gas supply mechanism (also referred to as a "purge gas supply system") configured to supply the purge gas to the heat insulating region is constituted mainly by the gas supply pipe 30c, the MFC 32c and the valve 34c. The purge gas supply mechanism is configured to supply the purge gas upward from a lower portion (lower end) of the heat insulating region. That is, the purge gas is supplied upward from a bottom of the heat insulating region through the gas supply pipe 30c in the housing 58A and around the rotating shaft 60.

Figure 2:
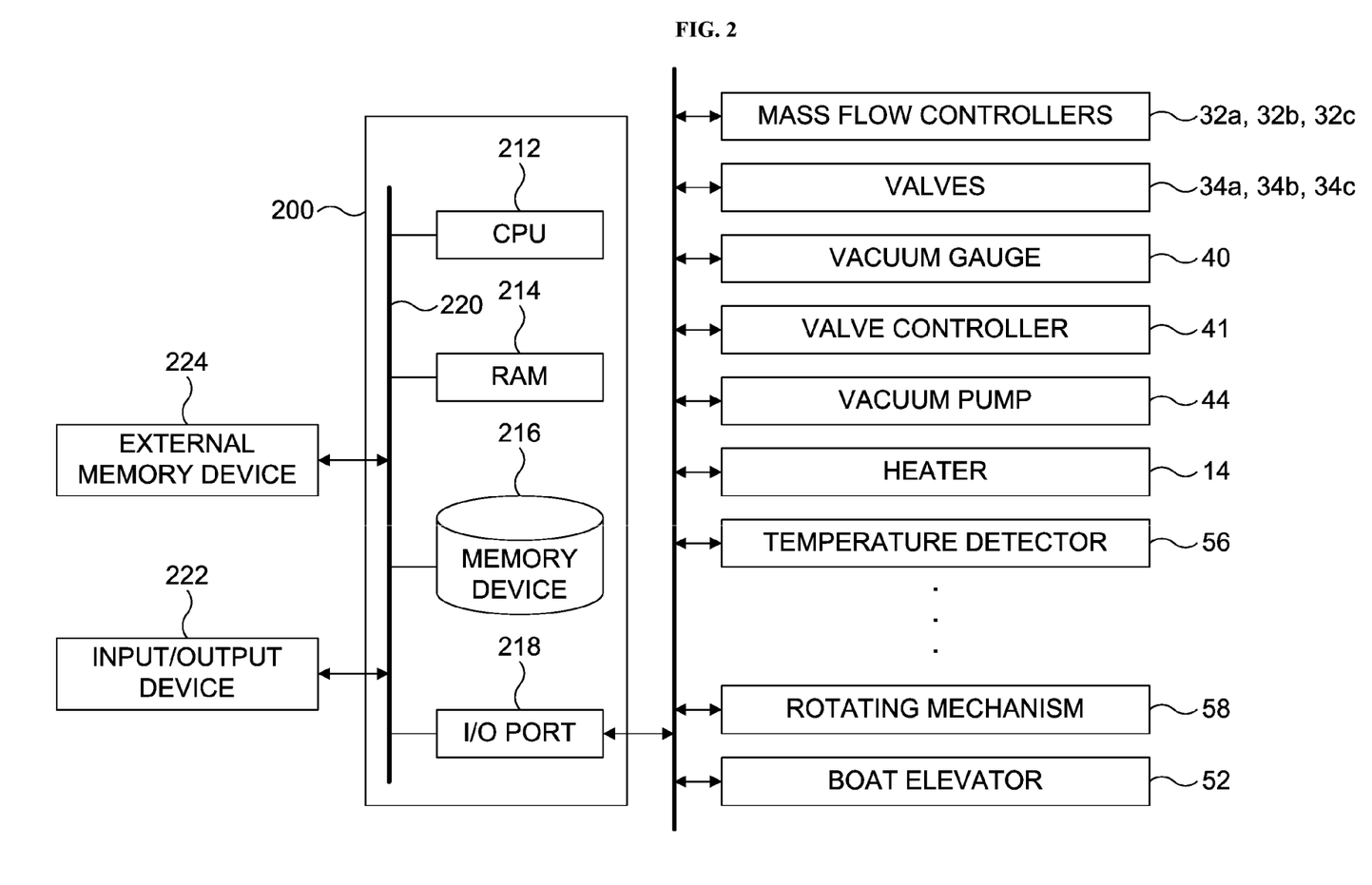
FIG. 2 is a block diagram schematically illustrating a configuration of a main controller and related components of the substrate processing apparatus according to the embodiments described herein.

As shown in FIG. 2, a main controller 200 of the substrate processing apparatus 10 is constituted by a computer including a CPU (Central Processing Unit) 212, a RAM (Random Access Memory) 214, a memory device 216 and an I/O port 218. The RAM 214, the memory device 216 and the I/O port 218 may exchange data with the CPU 212 through an internal bus 220. For example, an input/output device 222 such as a touch panel or an external memory device 224 may be connected to the main controller 200.

The memory device 216 is configured by components such as a flash memory and a hard disk drive (HDD). For example, a control program for controlling the operation of the substrate processing apparatus 10 or a process recipe containing information on the sequences and conditions of a substrate processing (for example, a film-forming process) described later is readably stored in the memory device 216. The process recipe is obtained by combining steps of the substrate processing described later such that the main controller 200 can execute the sequences to acquire a predetermine result, and functions as a program. Hereafter, the process recipe and the control program may be collectively or individually referred to as a "program". That is, in the present specification, the term "program" may indicate only the process recipe, may indicate only the control program, or may indicate both of the process recipe and the control program. The RAM 214 functions as a memory area (work area) where a program or data read by the CPU 212 is temporarily stored.

The I/O port 218 is connected to the above-described components such as the mass flow controllers (MFCs) 32a, 32b and 32c, the valves 34a, 34b and 34c, the vacuum gauge 40, the valve controller 41, the vacuum pump 44, the heater 14, the temperature detector 56, the rotating mechanism 58 and the boat elevator 52.

The CPU 212 is configured to read the control program from the memory device 216 and execute the read control program. In addition, the CPU 212 is configured to read the process recipe from the memory device 216 according to an operation command inputted from the input/output device 222. According to the contents of the read process recipe, the CPU 212 may be configured to control various operations such as flow rate adjusting operations for various gases by the MFCs 32a, 32b and 32c, opening/closing operations of the valves 34a, 34b and 34c, an opening/closing operation and a pressure adjusting operation of the APC valve 42 by the valve controller 41, a start and stop of the vacuum pump 44, a temperature adjusting operation of the heater 14 based on the temperature detector 56, an operation of adjusting rotation and rotation speed of the boat 26 by the rotating mechanism 58 and an elevating and lowering operation of the boat 26 by the boat elevator 52.

Configuration of Vacuum Pressure Control System

Figure 3:
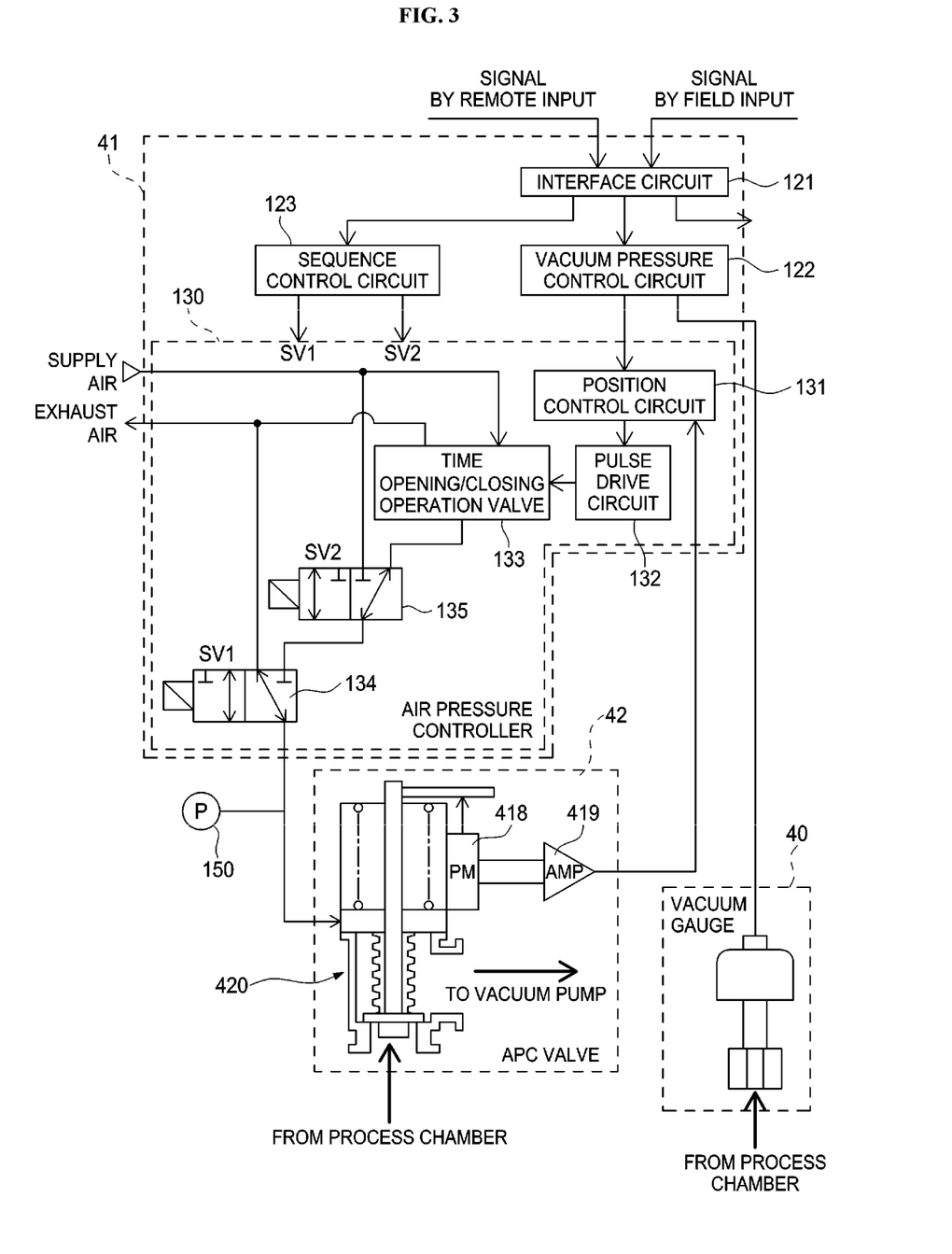
FIG. 3 schematically illustrates a configuration of a vacuum pressure control system 43 of the substrate processing apparatus according to the embodiments described herein.

FIG. 3 schematically illustrates a configuration of the vacuum pressure control system 43 according to the embodiments described herein. The vacuum pressure control system 43 is of a type in which an actual valve opening degree is detected by a position sensor (not shown) and is feedback-controlled. The vacuum pressure control system 43 includes the vacuum gauge 40, the valve controller 41 and the APC valve 42.

The valve controller 41 includes an interface circuit 121, a vacuum pressure control circuit (also referred to as a "first control circuit") 122, a sequence control circuit 123 and an air pressure controller (also referred to as an "air pressure control mechanism") 130. The interface circuit 121 converts a remote operation signal from the main controller 200 or a signal by a field input via a button on a front panel of the valve controller 41 into a signal suitable for components such as the vacuum pressure control circuit 122 and the sequence control circuit 123.

The vacuum pressure control circuit 122 is configured to perform a feedback control on a vacuum pressure in the process chamber 24 (that is, the inner pressure of the process chamber 24). The sequence control circuit 123 directly operates (adjusts or controls) a first electromagnetic valve 134 and a second electromagnetic valve 135 in the air pressure controller 130 to perform a predetermined operation according to an operation mode from the interface circuit 121. For example, the predetermined operation may include an operation of fully (completely) closing the APC valve 42 or an operation of fully (completely) opening the APC valve 42. The operation mode described above is mainly used for a stand-by, an emergency or a safety of the substrate processing apparatus 10.

The air pressure controller 130 includes a position control circuit (also referred to as a "second control circuit") 131, a pulse drive circuit 132, a temporal opening/closing operation valve 133, the first electromagnetic valve 134 and the second electromagnetic valve 135. The position control circuit 131, which is a kind of servo mechanism, is configured to compare a valve opening degree command value (also referred to as a "valve opening degree control signal") and a detected valve opening degree value to control a position of a valve body in the APC valve 42. The valve opening degree command value is transmitted from the vacuum pressure control circuit 122, and the detected valve opening degree value is transmitted from a potentiometer 418 (an example of the position sensor described above) provided at the APC valve 42 via an amplifier 419. The position control circuit 131 constitutes a control loop in the feedback control of the vacuum pressure control circuit 122. In the embodiments, the valve opening degree, which is a control amount of the air pressure controller 130, is distinguished from a process chamber pressure (that is, the inner pressure of the process chamber 24), which is a control amount of the vacuum pressure control circuit 122. The process chamber pressure (the inner pressure of the process chamber 24) may also be referred to as a "pressure of the process chamber 24". Hereinafter, the valve opening degree is also referred to as an "internal control amount". The valve opening degree is a parameter, which may be an operation amount or a control amount, including a lift amount, a cylinder pressure, a combined pressure value which will be described later and other virtual indicators. The pulse drive circuit 132 transmits a pulse signal to the temporal opening/closing operation valve 133 based on an electropneumatic control signal from the position control circuit 131.

A supply-side proportional valve (not shown) and an exhaust-side proportional valve (not shown) are embedded in the temporal opening/closing operation valve 133. The temporal opening/closing operation valve 133 is configured to open or close the supply-side proportional valve and the exhaust-side proportional valve according to the pulse signal from the pulse drive circuit 132. The temporal opening/ closing operation valve 133 is configured to adjust (control) an air pressure in a pneumatic cylinder of the APC valve 42 via the second electromagnetic valve 135 and the first electromagnetic valve 134. A pressure sensor (also simply referred to as a "sensor") 150 is connected to a pipe connecting the APC valve 42 and the air pressure controller 130 to measure the cylinder pressure (that is, the air pressure in the pneumatic cylinder) of the APC valve 42. The pressure sensor 150 outputs the pressure measurement result to the valve controller 41.

Figure 4:
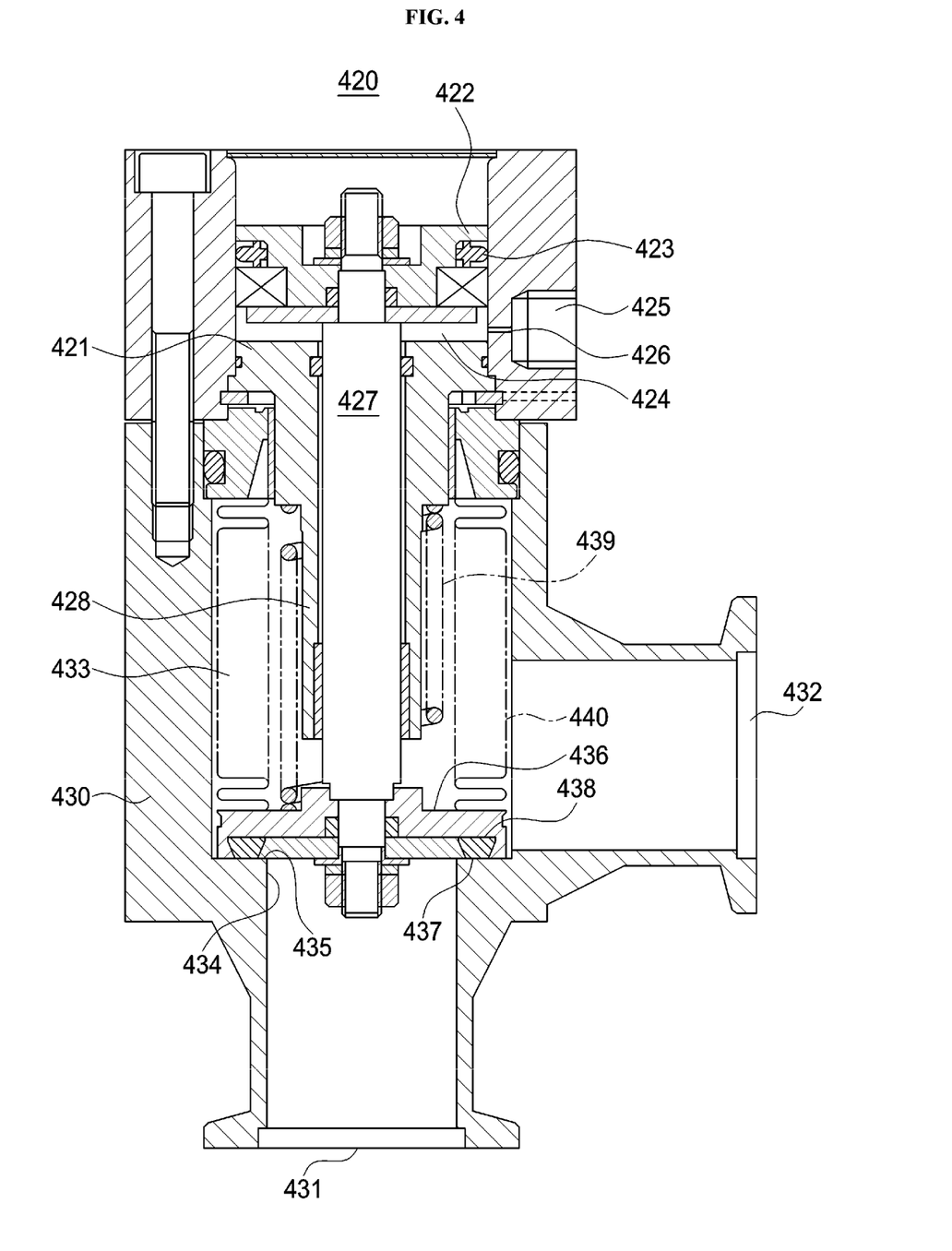
FIG. 4 schematically illustrates a cross-section of a vacuum valve of an APC valve 42.

For example, a vacuum valve 420 used as the APC valve 42 is an air operated type single-acting poppet valve. The vacuum valve 420 is configured to change a conductance of an exhaust system extending from the process chamber 24 to the vacuum pump 44. As shown in FIG. 4, a piston 422 is slidably loaded in a cylinder 421 connected to a valve body 430 of the vacuum valve 420. By bringing a packing 423 mounted on an outer peripheral surface of the piston 422 into sliding contact against an inner wall of the cylinder 421, an operation chamber 424 is airtightly formed in a valve seat side of the piston 422. The operation chamber 424 communicates with an operation port 425 opened (provided) in the cylinder 421 through a communication channel 426, and an operation fluid is supplied to and exhausted from the operation chamber 424. The piston 422 is connected to a valve element 436 through a piston rod 427 slidably supported by a rod support 428 of the cylinder 421, and is linearly reciprocated in an axial direction thereof (that is, the vertical direction in FIG. 4) as an integrated body with the valve element 436.

A valve element 436 is disposed (provided) in a valve chamber 433 of the valve body 430. The valve chamber 433 is configured to communicate with a first port 431 connected to the process chamber 24 and a second port 432 connected to the vacuum pump 44. A valve seat 435 is formed with a flat surface along an outer periphery of an opening 434 communicating with the first port 431. The valve element 436 is provided with a dovetail groove 437 formed at a position facing the valve seat 435, and an elastic sealing part (also referred to as an "elastic sealing member") 438 is provided in the dovetail groove 437 to be elastically deformable. The valve element 436 is constantly pressed toward the valve seat 435 by a compression spring 439 (which is an example of a sealing force applying means or a sealing force applying part), and the sealing load is applied to the elastic sealing part 438 so as to seal the elastic sealing part 438 to the valve seat 435. A bellows 440 is disposed in the valve chamber 433 to be extendable and contractible. The bellows 440 is arranged (provided) coaxially with the piston rod 427. One end of the bellows 440 is connected to the valve element 436 so as to define (form) a cylindrical space sealed from a flow path extending from the first port 431 to the second port 432.

The vacuum valve 420 is configured to perform a valve opening/closing operation by bringing the valve element 436 (specifically, the elastic sealing part 438) into contact with the valve seat 435 or by separating the valve element 436 (the elastic sealing part 438) from the valve seat 435. A distance between the valve element 436 and the valve seat 435, which is the lift amount of the valve, may be adjusted by supplying and exhausting compressed air to and from the operation chamber 424. The distance between the valve element 436 and the valve seat 435 may be measured by the potentiometer 418, and corresponds to the valve opening degree of the APC valve 42.

The vacuum pressure control system 43 according to the embodiments may select and set an operation mode among operation modes such as a forced close mode ("F. CLOSE"), a forced open mode ("F. OPEN") and a vacuum pressure control mode ("AUTO") by the valve controller 41.

When the vacuum pressure control system 43 selects the forced close mode ("F. CLOSE") as the operation mode by the valve controller 41, the sequence control circuit 123 keeps the first electromagnetic valve 134 and the second electromagnetic valve 135 de-energized as shown in FIG. 3. Accordingly, the compressed air is not supplied into the operation chamber 424 of the vacuum valve 420, and the operation chamber 424 communicates with an exhaust line (that is, the exhaust system). As a result, an air pressure in the operation chamber 424 becomes equal to the atmospheric pressure, and the vacuum valve 420 is shut off. Likewise, when the vacuum pressure control system 43 selects the forced open mode ("F. OPEN"), the sequence control circuit 123 energizes the first electromagnetic valve 134 and the second electromagnetic valve 135. The compressed air is supplied into the operation chamber 424 of the vacuum valve 420, and the vacuum valve 420 is fully opened up to a mechanical limit.

When the vacuum pressure control system 43 selects the vacuum pressure control mode ("AUTO") as the operation mode by the valve controller 41, the sequence control circuit 123 energizes the first electromagnetic valve 134 so that the temporal opening/closing operation valve 133 and the operation chamber 424 of the vacuum valve 420 are in communication with each other. Thereby, as the temporal opening/closing operation valve 133 and the operation chamber 424 are in communication with each other, it is possible to adjust the air pressure in the operation chamber 424, which makes it possible to adjust the lift amount of the valve.

When the vacuum pressure control system 43 selects the vacuum pressure control mode ("AUTO") as the operation mode, the vacuum pressure control circuit 122 starts the feedback control using a target vacuum pressure value instructed by the main controller 200 as a target value. That is, as shown in FIG. 1, a vacuum pressure value in the process chamber 24 (that is, an inner pressure value of the process chamber 24) is measured by the vacuum gauge 40, and the lift amount of the APC valve 42 is adjusted according to the difference (control deviation) between the vacuum pressure value and the target vacuum pressure value to change the conductance of the exhaust system. As a result, it is possible to maintain the vacuum pressure in the process chamber 24 to be constant at the target vacuum pressure value.

The feedback control may be implemented by a PID-based control, and more preferably, parameters such as a time constant and a gain may be changed according to predetermined conditions. For example, when the control deviation of the feedback control is large, a sufficiently speedy response of the feedback control is secured by minimizing the time constant of the feedback control or maximizing the gain. When the control deviation of the feedback control is small, the feedback control is performed step by step according to the parameters adjusted in advance, so that it is possible to maintain the vacuum pressure in the process chamber 24 in a stable state.

Figure 5:
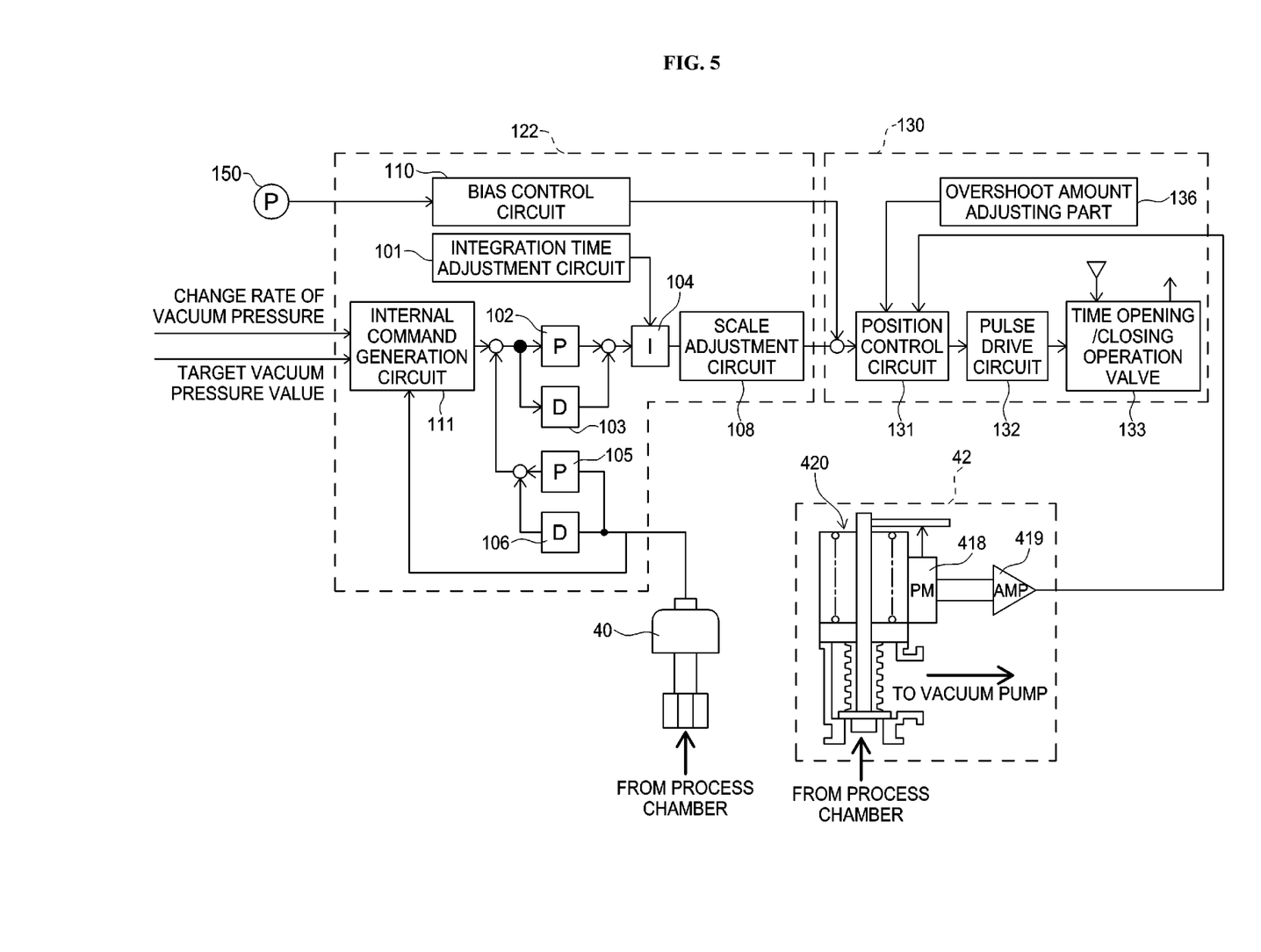
FIG. 5 schematically illustrates a feedback control system of the vacuum pressure control system 43 when the vacuum pressure control system 43 is at a vacuum pressure control mode.

The feedback control will be described in detail with reference to FIG. 5, which is a block diagram schematically illustrating a feedback control system of the vacuum pressure control system 43. The vacuum pressure value in the process chamber 24 measured by the vacuum gauge 40 is adjusted by a proportional circuit 105 and a differentiation circuit 106, and the adjusted vacuum pressure value in the process chamber 24 is compared with the target vacuum pressure value maintained by an internal command generation circuit 111. The difference (also referred to as an "error signal") between the adjusted vacuum pressure value in the process chamber 24 and the target vacuum pressure value is input to a proportional circuit 102 and a differentiation circuit 103. An integration circuit 104 outputs the valve opening degree command value, obtained by integrating the sum of outputs of the proportional circuit 102 and the differentiation circuit 103, to the position control circuit 131 as a voltage in the range of 0 V to 5 V. The value "5 V" described above corresponds to a full opening degree (hereinafter, also referred to as an "electrically defined full opening degree") of the APC valve 42 in the vacuum pressure control mode (under feedback control). A position of the valve body in the APC valve 42 is different between a case where the APC valve 42 is at the electrically defined full opening degree and a case where the APC valve 42 is at a full opening degree in the forced open mode (hereinafter, also referred to as a "mechanically (physically) defined full opening degree"). In order to stabilize a servo control of the air pressure controller 130, the valve element 436 slightly approaches the valve seat side when the APC valve 42 is at the electrically defined full opening degree. In this case, the lift amount is about 42 mm away from a leak position (also referred to a "leak start position"). Hereinafter, the term "electrically defined full opening degree" may be simply referred to as the full opening degree.

An integration time adjustment circuit 101 determines a time constant of the integration circuit 104. For example, when the value (that is, the vacuum pressure value in the process chamber 24) measured by the vacuum gauge 40 is far from the target vacuum pressure value, an internal arithmetic circuit of the integration time adjustment circuit 101 is operated so that an integration time of the integration circuit 104 becomes relatively small. Thereby, the integration circuit 104 can function as an amplifier circuit of a relatively large gain.

That is, when the value measured by the vacuum gauge 40 is greater than the target vacuum pressure value, the integration circuit 104 outputs "5 V", which is a maximum value of the integration circuit 104, to the position control circuit 131. As a result, the APC valve 42 is opened rapidly. On the other hand, when the value measured by the vacuum gauge 40 is smaller (less) than the target vacuum pressure value, the integration circuit 104 outputs "0 V", which is a minimum value of the integration circuit 104, to the position control circuit 131. As a result, the APC valve 42 is closed rapidly.

By the operations described above, the valve opening degree of the APC valve 42 can nearly reach a position required for the target vacuum pressure value in the shortest time possible. Thereafter, the integration time adjustment circuit 101 determines that the valve opening degree of the APC valve 42 has nearly reached the above-mentioned position, and the integration time adjustment circuit 101 performs a stepwise transition for the time constant of the integration circuit 104 to reach the adjusted time constant determined in advance in order to maintain the vacuum pressure in a stable state at the above-mentioned position. The operation of stepwise transition may be performed by, for example, three or more steps.

Normally, the internal command generation circuit 111 holds the target pressure transmitted from the interface circuit 121 and outputs the target pressure. In addition, the process chamber pressure (that is, the inner pressure of the process chamber 24) is monitored by the vacuum gauge 40. Thereby, when the rate of change in the process chamber pressure is expected to exceed a target pressure change rate due to a large difference between the process chamber pressure and the target pressure or when a convergence time is expected to be prolonged due to conditions such as an overshoot or a hunting generated by the feedback control, the internal command generation circuit 111 may change the target pressure. That is, internal commands are sequentially generated in order to change the target pressure stepwise to reach the changed target pressure. It is also possible to change the target pressure almost continuously by setting each step of change in the target pressure to be sufficiently small.

A scale adjustment circuit (also referred to as a "span adjustment circuit") 108 multiplies the valve opening degree command value outputted from the integration circuit 104 by a gain value G, and outputs the multiplication result. The gain value G is usually around 1. It is possible to change a range (also referred to as a "scale" or a "span") of the valve opening degree command value by the gain value G, and as a result, it is possible to adjust the electrically defined full opening degree.

The bias control circuit 110 calculates and outputs a bias value (also referred to as an "offset value") B to be added to the valve opening degree command value after its scale is adjusted by the scale adjustment circuit 108. The bias value B corresponds to a position of the valve seat 435 (that is, the leak start position described above) when the elastic sealing part 438 loses the sealing force. Actually, the offset value B may be obtained by adding a predetermined squeeze amount (margin) to the measured leak start position. After the offset is applied, the valve opening degree command value has a minimum value corresponding to the leak start position and a maximum value corresponding to the electrically defined full opening degree.

Methods of determining the bias value B by the bias control circuit 110 will be described. The leak start position may vary depending not only on the state of the elastic sealing part 438 but also on a differential pressure of the valve (that is, a pressure difference between the process chamber 24 and the vacuum pump 44). In the embodiments, it is assumed that a pressure of the vacuum pump 44 is constant or sufficiently small and that the differential pressure of the valve depends on the process chamber pressure (that is, the inner pressure of the process chamber 24). It is known that a sum of the process chamber pressure detected by the vacuum gauge 40 and the cylinder pressure detected by the pressure sensor 150 is substantially constant always at the start of the leak.

According to a first determination method of determining the bias value B, the bias control circuit 110 monitors an output of the integration circuit 104 and, while the output of the integration circuit 104 is 0 V (that is, the minimum value), performs the following process. That is, a negative feedback control is performed in which a sum of the pressure measured by the pressure sensor 150 and the pressure measured by the vacuum gauge 40 is compared with a leak start reference pressure stored in advance, and the bias value B is adjusted according to an error therebetween. For example, the error signal is integrated using the current bias value B as an initial value. As a result, the cylinder pressure corresponds to the leak start position, and the leak can be started immediately when the output of the integration circuit 104 becomes non-zero.

According to a second determination method of determining the bias value B, a leak start reference position measured in advance at a predetermined process chamber pressure (for example, 100 Pa) and the dependence of the leak start position on the process chamber pressure (for example, a proportional constant or a polygonal line approximation table) are stored. Then, the leak start position corresponding to the process chamber pressure is calculated and output as the bias value B while the output of the integration circuit 104 is at the minimum value or at all times.

As described above, when the bias value B is dynamically adjusted so that the minimum value of the valve opening degree command value corresponds to the leak start position, the maximum value of the valve opening degree command value to which the bias value B is added is also changed. Therefore, it may be difficult to update the electrically defined full opening degree. However, according to the embodiments, the scale adjustment circuit 108 updates the gain value G by following the change of the bias value B.

Let "$V_{max}$" indicate the maximum value (5 V) of the integration circuit 104 and "$G_{Ref}$" indicate a reference gain which is a gain when the bias value B is not added to the valve opening degree command value (that is, the bias value B is 0). Then, the gain value G is calculated by the following equation:

$$G = G_{Ref} \times (V_{max} - B) / V_{max}$$

The reference gain $G_{Ref}$ may be 1, for example, and a self-calibration of the reference gain $G_{Ref}$ may be performed as necessary. That is, the output of the integration circuit 104 is set to the maximum value (5 V) and the bias value B is set to zero (0) at an initial operation of the vacuum pressure control system 43 on the assumption that an output of the potentiometer 418 indicates the actual valve opening degree (conductance). Then, the reference gain $G_{Ref}$ is adjusted so that the opening degree output from the potentiometer 418 indicates the full opening degree based on a desired reference (for example, corresponding to the lift amount of 42 mm). Further, since the output of the potentiometer 418 may oscillate, it should be used after being averaged out sufficiently. In addition, a response of the operation amount (the lift amount or the process chamber pressure) in an operation pattern of the APC valve 42 may be measured during the actual film-forming process, and a trace of the response of the operation amount may be compared with a standard response and be corrected so as to approach the standard response.

Figure 6:
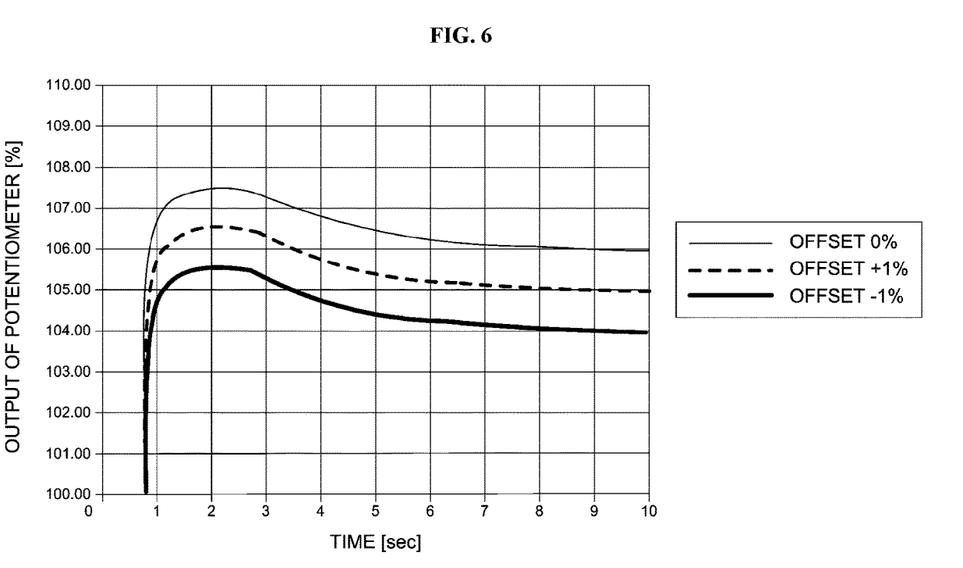
FIG. 6 schematically illustrates exemplary time responses of a lift amount of the APC valve 42 in a feedback control.

FIG. 6 schematically illustrates exemplary time responses of the lift amount of the APC valve 42 in the feedback control. The graphs shown in FIG. 6 illustrate the outputs of the potentiometer 418 when the APC valve 42 is operated from a full closing degree (at which the APC valve 42 is fully closed) to the full opening degree for three reference gains $G_{Ref}$ of 1.04, 1.05 and 1.06, respectively. The lift amount converges monotonously toward the target value after overshooting once, and these three time responses behave almost the same except that the target values are different. Thus, the output of the position control circuit 122 is adjusted by the gain of the scale adjustment circuit 108 (that is, the reference gain $G_{Ref}$), and an upper limit of the valve opening degree of the second control circuit 131 (that is, the position control circuit 131) is set to a predetermined value smaller than the physically defined full opening degree.

In the actual film-forming process, an exhaust flow velocity or an ultimate vacuum degree in the process chamber 24 may be changed due to a slight difference in the opening degree of the APC valve 42. The ultimate vacuum degree in the process chamber 24 may be significantly affected when the purge gas or a ballast gas is supplied during the exhaust or when a gas supply sequence is strictly defined by a time pattern. The exhaust flow velocity may be significantly affected when the APC valve 42 is fully opened rapidly (that is, the opening degree of the APC valve 42 is adjusted to the full opening degree rapidly) in a state where the process chamber 24 is filled with the process gas, and especially when the overshoot shown in FIG. 6 occurs. As a result, at least one of the following problems may occur.

A first problem is that, after a predetermined time has elapsed with the APC valve 42 fully opened, a concentration of a residual gas in the process chamber 24 may become different.

A second problem is that, during the transition to the full opening degree of the APC valve 42, a difference in parameter such as the gain may cause a difference in transient response characteristics of the system (such as the vacuum pressure control system 43) even if a constant rate control is applied. Therefore, the process chamber pressure or the valve opening degree may vary during the transition from the full opening degree of the APC valve 42 to a constant pressure operation of the APC valve 42, and the time duration and the accuracy of maintaining the target pressure may also vary during the constant pressure operation.

A third problem is that, if the exhaust flow velocity changes, the Reynolds number changes, a vortex or a turbulence near a surface of the wafer W also changes, and an escape rate of an adsorbed gas from a patterned trenches or a via (together with a desorption from the surface of the wafer W and a Knudsen diffusion) changes as well. As a result, the film-forming quality may be affected. The inventors of the present application have confirmed that, when a silicon nitride film is deposited, the composition (nitrogen concentration) of the silicon nitride film changes when there is a machine difference of ±0.4 mm in the overshoot with respect to a range of the lift amount of 42 mm while the APC valve 42 is fully opened.

The third problem suggests that, when there is a machine difference in an overshoot amount strongly depending on the characteristics of a servo system of the air pressure controller 130, the gain adjusted by the scale adjustment circuit 108 may be imperfect. As a factor that may cause the machine difference in the characteristics of the air pressure controller 130, a dead zone of the temporal opening/closing operation valve 133 is considered. Therefore, as shown in FIG. 5, the air pressure controller 130 may be provided with an overshoot amount adjusting part (also referred to as an "overshoot amount adjustor") 136 so as to adjust the characteristics thereof. The overshoot amount adjusting part 136 is configured to adjust each parameter of PID (proportional integral derivative) control of the position control circuit 131. In addition, the position control circuit 131 may generate two signals representing an opening/closing time of the two valves in the temporal opening/closing operation valve 133, which are to be supplied to the pulse drive circuit 132, by using a rectified linear unit function (also referred to as a "ReLU function"). In this case, the origin offsets thereof can be adjusted to manipulate the dead zone. Circuits (or parts) capable of setting the upper limit of the valve opening degree including the scale adjustment circuit 108 and the overshoot amount adjusting part 136 may be collectively referred to as the span adjustment circuit 108. The overshoot amount adjusting part 136 may be configured to set constant parameters in the position control circuit 131 at all times, or may be configured to set special alternative parameters when the overshoot may occur.

Figure 7:
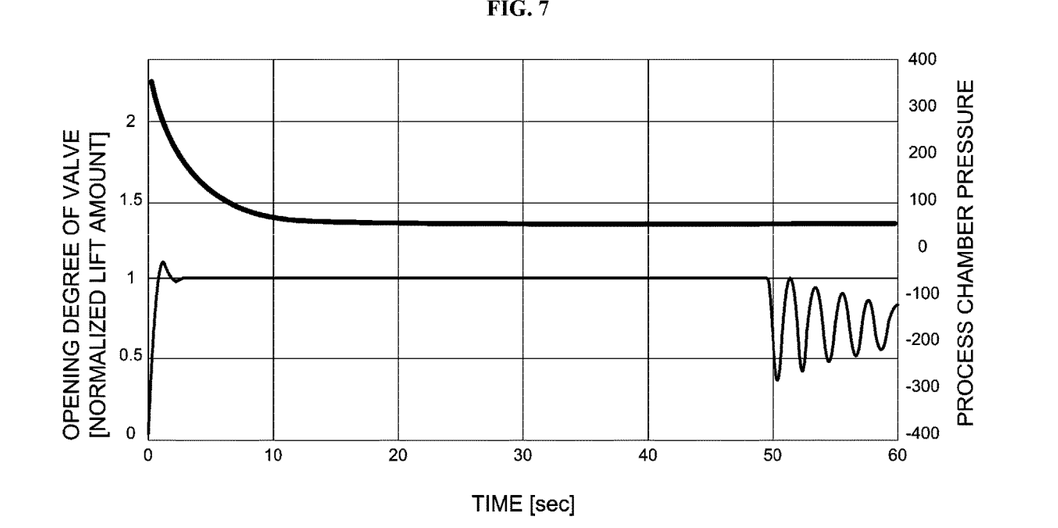
FIG. 7 schematically illustrates an example of a time response of the lift amount and an inner pressure of a process chamber 24 in the feedback control.

FIG. 7 schematically illustrates an example of the time response of the lift amount and the process chamber pressure in the feedback control. The graph shown in FIG. 6 illustrates the output of the potentiometer 418 of the process chamber 24 when the APC valve 42 is switched from the full closing degree (or a constant pressure control) to the full opening degree, a predetermined amount of the gas is continuously supplied to the process chamber 24 while the APC valve 42 is fully opened (that is, at the full opening degree), and the operation is shifted to the constant pressure control of 50 Pa close to the ultimate vacuum degree after 50 seconds. Immediately after switching to the full opening degree, the process chamber pressure decreases exponentially and smoothly, and such phenomenon as hunting is not observed even after shifting to the constant pressure control of 50 Pa close to the ultimate vacuum degree. When analyzed precisely, the process chamber pressure while shifting to the constant pressure control of 50 Pa vary slightly depending on the reference gain $G_{Ref}$, and the process chamber pressure becomes lower as the reference gain $G_{Ref}$ becomes larger.

Immediately after the APC valve 42 enters into the full opening degree, a slight overshoot as shown in FIG. 6 arises, and then the lift amount stably maintains an opening degree corresponding to the reference gain $G_{Ref}$. However, when entering into the constant pressure control, undesired hunting may occur due to the shock of the transition. The hunting is sensitive to the difference between the process chamber pressure during the transition to the constant pressure control and the target pressure (50 Pa) of the constant pressure control. Since the undesired hunting arises in a vacuum region where the pressure change due to the lift amount is small, the lift amount oscillates noticeably. As a result, an initial value of the lift amount at the fully closing degree or the constant pressure control may be disturbed after 10 seconds of the constant pressure control.

The gain of the span adjustment circuit 108 may be calibrated (corrected) by the following methods.

According to a first calibration method, the reference gain $G_{Ref}$ may be calibrated based on the convergence characteristics. That is, while the main controller 200 executes a process of repeating the recipe comprising an exhaust operation pattern as shown in FIG. 7, the main controller 200 measures the process chamber pressure a plurality of times (for example, the number of iterations) and averages out the measured data of the process chamber pressure immediately before the transition from the full opening degree to the constant pressure control or at the final stage of the constant pressure control. Then, the averaged process chamber pressure is compared with a reference process chamber pressure. When the averaged process chamber pressure is higher than the reference process chamber pressure, the reference gain $G_{Ref}$ of the scale adjustment circuit 108 is corrected to be slightly increased. Conversely, when the averaged process chamber pressure is less than the reference process chamber pressure, the reference gain $G_{Ref}$ is corrected to be slightly decreased. Then, the main controller 200 notifies the result (that is, the change of the reference gain $G_{Ref}$) to the valve controller 41. A correction amount of the reference gain $G_{Ref}$ may be determined by an algorithm such as a steepest descent method, a MMSE (Minimum Mean Square Error) standard, a dynamic programming method, a simulated annealing method and a neighborhood search method. For example, the neighborhood search method is an algorithm that the correction amount is adopted when the error is decreased by the reference gain $G_{Ref}$ being corrected based on the correction amount, and that the correction amount is discarded and a correction amount is used with its sign inverted in the next trial when the error is increased by the reference gain $G_{Ref}$ being corrected based on the correction amount.

According to a second calibration method, the reference gain $G_{Ref}$ may be calibrated based on the transient response characteristic in the constant pressure control. That is, when the valve controller 41 is notified of a time period of the constant pressure control described above from the main controller 200, the valve controller 41 records the number of huntings having occurred during the time period, the lift amount or the cylinder pressure measured at the end of the time period and their time derivatives, and averages them out. The averaged values are compared with a reference number, a reference lift amount or a reference cylinder pressure, a reference differential lift amount and a reference differential cylinder pressure, respectively. Based on the comparison result, the reference gain $G_{Ref}$ of the scale adjustment circuit 108 is slightly corrected using the algorithm as described above. In the second calibration method, as long as the lift amount or the cylinder pressure matches the reference lift amount or the reference cylinder pressure, it does not matter whether the number of the huntings and the differentiated values are consistent or not.

According to a third calibration method, parameters of the air pressure controller 130 may be adjusted based on a transient response characteristic when the APC valve 42 is at the full opening degree (that is, fully opened). That is, the main controller 200 controls the valve controller 41 to measure the overshoot amount of the lift amount a plurality of times immediately after the transition from the fully closing degree or the constant pressure control of the predetermined pressure to the full opening degree while executing a predetermined recipe. Then, the main controller 200 records the overshoot amounts of the lift amount measured as above, and averages out the overshoot amounts of the lift amount. Then, the averaged overshoot amount of the lift amount is compared with a reference overshoot amount. Based on the comparison result, the parameters of the overshoot amount adjusting part 136 are slightly corrected using the algorithm as described above. The first calibration method through the third calibration method may be used in combination.

First Modified Example of Vacuum Pressure Control System

The vacuum pressure control system 43 multiplies the output of the integration circuit 104, which outputs the valve opening degree command value, by the gain G, and then adds thereto the offset value B. Herein, the opposite may also be possible. Alternatively, the output of the potentiometer 418 may be multiplied by the gain G. In this case, the bias value corresponding to the leak start position changes if the gain G changes. Therefore, it is necessary to update the bias value.

Second Modified Example of Vacuum Pressure Control System

The vacuum pressure control system 43 adjusts the range of the valve opening degree command value by applying the offset value B and the gain G to the output of the integration circuit 104 that outputs the valve opening degree command value. However, it is possible to obtain the same effect by directly setting a lower limit value and an upper limit value of the output of the integration circuit 104. The lower limit value may be the same as the offset value B, and the upper limit value may be fixed (5 V) or may be determined in the same manner as the calibration methods of the reference gain $G_{Ref}$ described above.

According to the second modified example, the upper limit value may be uniquely set independently of the lower limit value. Therefore, it is unnecessary to correct the upper limit value to follow the offset value B. However, a final value of the valve opening degree command value needs to be determined by a single integration circuit, and the configuration of PID control is limited.

Third Modified Example of Vacuum Pressure Control System

The vacuum pressure control system 43 is configured as a control system using the lift amount as the operation amount. However, the vacuum pressure control system 43 may be configured as a control system using the cylinder pressure as the operation amount. The sum (total pressure value) of the pressure measured by the pressure sensor 150 and the pressure measured by the vacuum gauge 40 corresponds exactly to the valve opening degree, and represents substantially the same amount as the lift amount except for the scale. That is, the control is performed so that the total pressure value matches the valve opening degree command value. The valve opening degree command value (or the total pressure value) corresponding to the full opening degree may be determined by setting the gain or an integral upper limit value so that the maximum value of the valve opening degree command value coincides with a predetermined full opening degree reference value. According to the third modified example, a potentiometer is not necessary.

Substrate Processing Method Using Substrate Processing Apparatus

Figure 8:
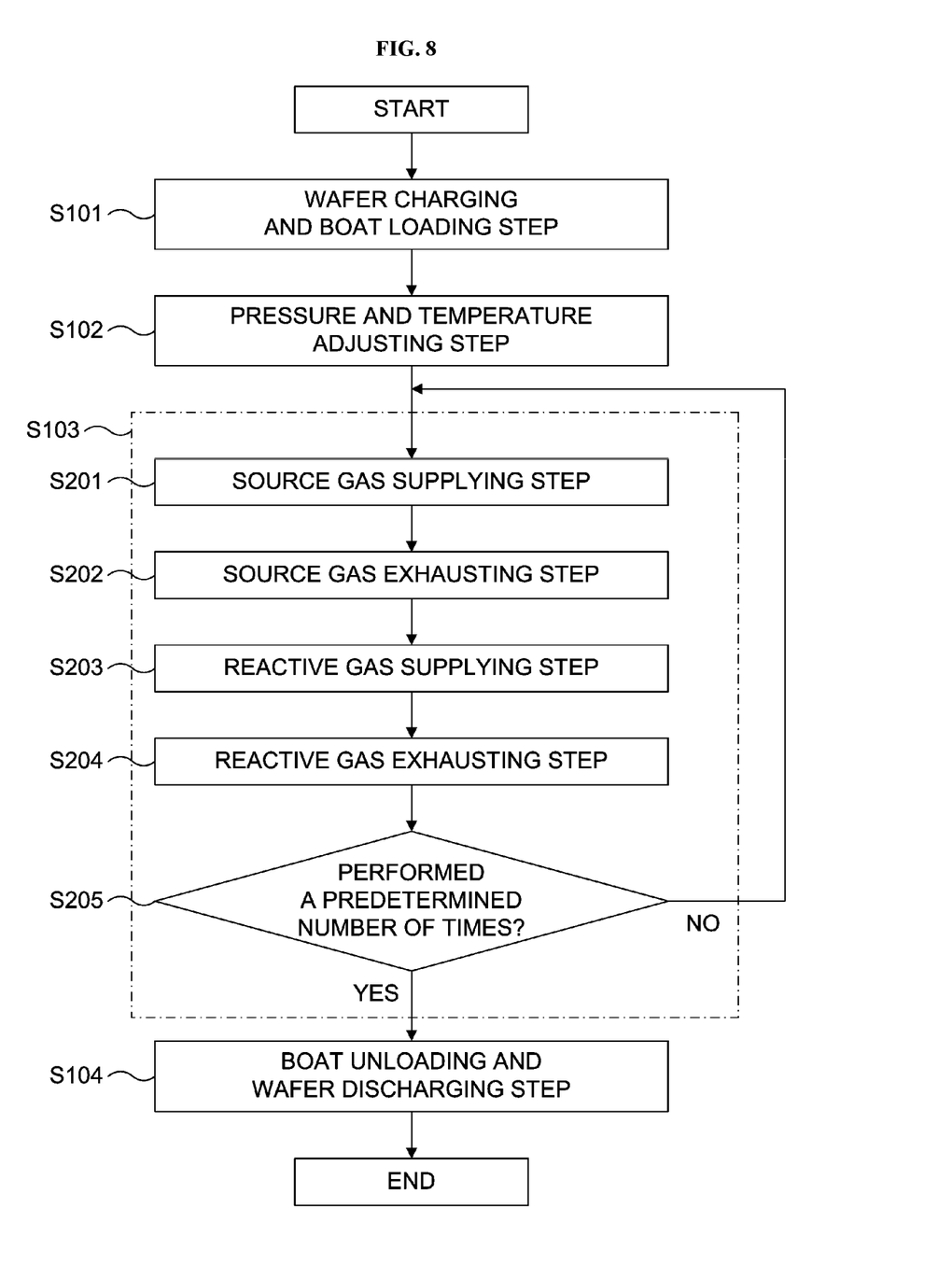
FIG. 8 is a flow chart schematically illustrating a method of manufacturing a semiconductor device according to the embodiments described herein.

Hereinafter, an exemplary sequence of a substrate processing (hereinafter, also referred to as a "film-forming process") of forming a film on a substrate (that is, the wafer W), which is a part of manufacturing processes of a semiconductor device, will be described with reference to FIG. 8. The exemplary sequence of the substrate processing is performed using the substrate processing apparatus 10. The exemplary sequence of the substrate processing will be described by way of an example in which a film is formed on the wafer W serving as the substrate by alternately supplying the first process gas (also referred to as a "source gas") and the second process gas (also referred to as a "reactive gas") to the wafer W.

Hereinafter, an example in which a silicon-rich silicon nitride film (hereinafter, also referred to as an "SiN film") is formed on the wafer W by using hexachlorodisilane ($Si_2Cl_6$, abbreviated as HCDS) gas as the source gas and ammonia ($NH_3$) gas as the reactive gas. In the following descriptions, the operations of the components constituting the substrate processing apparatus 10 are controlled by the main controller 200.

According to the exemplary sequence of the substrate processing (that is, the film-forming process), the SiN film is formed on the wafer W by performing a cycle a predetermined number of times (at least once). For example, the cycle may include: a step S201 of supplying the HCDS gas to the wafer W in the process chamber 24; a step S202 of removing the HCDS gas (residual gas) from the process chamber 24; a step S203 of supplying the $NH_3$ gas to the wafer W in the process chamber 24; and a step S202 of removing the $NH_3$ gas (residual gas) from the process chamber 24. The steps S201, S202, S203 and S204 of the cycle are non-simultaneously performed.

In the present specification, the term "wafer" may refer to "a wafer itself" or may refer to "a wafer and a stacked structure (aggregated structure) of a predetermined layer (or layers) or a film (or films) formed on a surface of the wafer". Similarly, the term "a surface of a wafer" may refer to "a surface of a wafer itself" or may refer to "a surface of a predetermined layer or film formed on the wafer, that is, a top surface (uppermost surface) of the wafer as a stacked structure". In the present specification, the term "substrate" and "wafer" may be used as substantially the same meaning. That is, the term "substrate" may be substituted by "wafer" and vice versa.

Wafer Charging and Boat Loading Step S101

The plurality of the wafers including the wafer W is charged (transferred) into the boat 26 (wafer charging step). Then, the boat 217 charged with the plurality of the wafers is elevated by the boat elevator 52 and loaded (transferred) into the process chamber 24 (boat loading step). With the boat 217 loaded, the seal cap 46 seals (closes) the lower end opening of the manifold 22 via the O-ring 48. When the lower end opening of the manifold 22 is airtightly sealed from a stand-by state before the wafer charging step, the valve 34c is opened and the purge gas is supplied to the heat insulating region in the process chamber 24. The purge gas supplied from the lower portion of the heat insulating region to an upper portion of the heat insulating region purges the heat insulating part 54 and around the heat insulating part 54 (that is, the heat insulating region), and is exhausted through the sub exhaust port 62. By maintaining the supply of the purge gas from the lower portion to the upper portion of the heat insulating region and exhausting the purge gas through the sub exhaust port 62 provided on the side facing the heat insulation region, it is possible to prevent the purge gas from diffusing into a film-forming region (that is, the process region). The valve 34c may be opened and the purge gas may be supplied to the heat insulating part 54 from the stand-by state before the wafer charging step. When the purge gas is supplied to the heat insulating part 54 from the stand-by state before the wafer charging step, it is possible to prevent particles from the outside during the wafer charging step from adhering to the heat insulating part 54.

Pressure and Temperature Adjusting Step S102

The vacuum pump 44 vacuum-exhausts the inner atmosphere of the process chamber 24 until the inner pressure of the process chamber 24 in which the plurality of the wafers including the wafer W is accommodated reaches a desired pressure (vacuum degree). In the pressure and temperature adjusting step S102, the inner pressure of the process chamber 24 is measured by vacuum gauge 40, and the APC valve 42 is feedback-controlled based on the measured pressure. The vacuum pump 44 continuously vacuum-exhausts the inner atmosphere of the process chamber 24 until at least the processing of the wafer W is completed.

The heater 14 heats the process chamber 24 until the inner temperature of the process chamber 24 reaches a desired temperature. The state of the electric conduction to the heater 14 is feedback-controlled based on the temperature detected by the temperature detector 56 such that the inner temperature of the process chamber 24 has a desired temperature distribution. The heater 14 continuously heats the process chamber 24 until at least the processing of the wafer W is completed.

Then, the rotating mechanism 58 rotates the boat 26 and the plurality of the wafers including the wafer W. That is, the rotating mechanism 58 rotates the plurality of the wafers by rotating the boat 26 via the rotating shaft 60. The rotating mechanism 58 continuously rotates the boat 26 and the plurality of the wafers until at least the processing of the wafer W is completed.

Film-forming Step S103

When the inner temperature of the process chamber 24 is stabilized at a predetermined process temperature, a film-forming step S103 is performed by sequentially performing the following four steps, that is, the steps S201, S202, S203 and S204.

Source Gas Supplying Step S201

In the source gas supplying step S201, by supplying the HCDS gas to the wafer W in the process chamber 24, a silicon-containing layer having a thickness of, for example, less than one atomic layer to several atomic layers is formed as a first layer on an outermost surface of the wafer W.

Specifically, the valve 34a is opened to supply the HCDS gas into the gas supply pipe 30a. The flow rate of the HCDS gas supplied into the gas supply pipe 30a is adjusted by the MFC 32a. The HCDS gas having the flow rate thereof adjusted is then supplied into the process region of the process chamber 24 through the plurality of the gas ejection holes 28A of the nozzle 28, the gas supply space of the supply buffer 24A and the plurality of the gas supply ports 36A, and is exhausted through the exhaust pipe 38 via the first exhaust port 36B and the exhaust buffer 24B. In the source gas supplying step S201, simultaneously, the valve 34b is opened to supply the inert gas such as the $N_2$ gas into the gas supply pipe 30b. After the flow rate of the $N_2$ gas is adjusted by the MFC 32b, the $N_2$ gas having the flow rate thereof adjusted is supplied into the process region of the process chamber 24 with the HCDS gas through the plurality of the gas ejection holes 28A of the nozzle 28, the gas supply space of the supply buffer 24A and the plurality of the gas supply ports 36A, and is exhausted the exhaust pipe 38 via the first exhaust port 36B and the exhaust buffer 24B. In the source gas supplying step S201, the vacuum pressure control system 43 performs the constant pressure control using a first pressure as a target pressure. However, since the process chamber pressure is considerably lower than the target pressure at the initial stage of the source gas supplying step S201, the APC valve 42 is fully closed (that is, at the full closing degree), and is fully closed or slightly opened at the end stage of the source gas supplying step S201.

Source Gas Exhausting Step S202

After the first layer is formed, the valve 34a is closed to stop the supply of the HCDS gas into the process chamber 24, and the constant pressure control (that is, a full opening degree control) is performed so that the target pressure is zero. As a result, the vacuum pump 44 vacuum-exhausts the inner atmosphere of the process chamber 24 to remove the HCDS gas in the process chamber 24 which did not react or which contributed to the formation of the first layer from the process chamber 24. In the source gas exhausting step S202, by maintaining the valve 34b open, the $N_2$ gas is continuously supplied into the process chamber 24. The $N_2$ gas serves as the purge gas, which improves the efficiency of removing the residual gas such as the HCDS gas in the process chamber 24 from the process chamber 24. When variations in the ultimate vacuum degree in the process chamber 24 affect the film quality, the target pressure may be set to a predetermined value that can be reached (for example, 50 Pa). The target pressure may be changed to 50 Pa in the middle of the source gas exhausting step S202, as shown in FIG. 7.

Reactive Gas Supplying Step S203

After the source gas exhausting step S202 is completed, the $NH_3$ gas is supplied to the wafer W in the process chamber 24, that is, supplied to the first layer formed on the wafer W. In the reactive gas supplying step S203, the $NH_3$ gas is thermally activated and then supplied to the wafer W. The thermally activated $NH_3$ gas reacts with at least a portion of the first layer (that is, the silicon-containing layer) formed on the wafer W in the source gas supplying step S201. As a result, the first layer is modified (changed) into a second layer containing silicon (Si) and nitrogen (N), that is, a silicon nitride layer.

In the reactive gas supplying step S203, the valves 34a and 34b are controlled in the same manners as in the source gas supplying step S201. Specifically, the flow rate of the $NH_3$ gas is adjusted by the MFC 32a. Then, the $NH_3$ gas having the flow rate thereof adjusted is then supplied into the process region of the process chamber 24 through the plurality of the gas ejection holes 28A of the nozzle 28, the gas supply space of the supply buffer 24A and the plurality of the gas supply ports 36A, and is exhausted through the exhaust pipe 38 via the first exhaust port 36B and the exhaust buffer 24B. In the reactive gas supplying step S203, the APC valve 42 is fully closed (that is, at the full closing degree), and is fully closed at the initial stage of the reactive gas supplying step S203.

Reactive Gas Exhausting Step S204

After the second layer is formed, the valve 34a is closed to stop the supply of the $NH_3$ gas into the process chamber 24, and the constant pressure control (that is, the full opening degree control) is performed so that the target pressure is zero. As a result, the vacuum pump 44 vacuum-exhausts the inner atmosphere of the process chamber 24 to remove the $NH_3$ gas in the process chamber 24 which did not react or which contributed to the formation of the second layer from the process chamber 24. In the reactive gas exhausting step S204, similar to the source gas exhausting step S202, the $N_2$ gas may be continuously supplied into the process chamber 24 as the purge gas.

Performing Predetermined Number of Times S205

By performing the cycle wherein the steps S201 through S204 described above are performed non-simultaneously in order a predetermined number of times (n times), the SiN film having a predetermined composition and a predetermined thickness is formed on the wafer W. The thicknesses of the first layer and the second layer formed in the steps S201 and S203, respectively, are not necessarily self-limiting. Therefore, in order to obtain a stable film quality, it is necessary that the concentration of the gas exposed to the wafer W and the supply time (time duration) of the gas exposed to the wafer W is precisely controlled with the high reproducibility. The steps S201 and S202 or the steps S203 and S204 may be performed (repeated) a plurality of times within the cycle.

Boat Unloading and Wafer Discharging Step S104

The inner atmosphere of the process chamber 24 is replaced with the inert gas (substitution by inert gas), and the inner pressure of the process chamber 24 is returned to the normal pressure (that is, the atmospheric pressure). Thereafter, the seal cap 46 is lowered by the boat elevator 52 and the lower end opening of the manifold 22 is opened. The boat 26 with the plurality of processed wafers including the wafer W charged therein is unloaded (transferred) out of the reaction tube 18 through the lower end opening of the manifold 22 (boat unloading step). After the boat 26 is unloaded, the plurality of the processed wafers including the wafer W is discharged (transferred) from the boat 26 (wafer discharging step).

Other Embodiments

While the technique is described by way of the above-described embodiments, the above-described technique is not limited thereto. The above-described technique may be modified in various ways without departing from the gist thereof. For example, the above-described embodiments may be applied to form a film under a reduced pressure by those skilled in the art. For example, the above-described embodiments may be applied to perform a process such as an oxidation process, a diffusion process, an annealing process and an etching process. The processing gas may be used in combination of three or more kinds of source gases and reaction gases.

As described above, according to some embodiments in the present disclosure, it is possible to substantially cancel out a machine difference of a pressure control valve and easily reproduce the same process.

What is claimed is:

1. A substrate processing apparatus comprising:
    a process chamber in which a substrate is processed;
    a vacuum pump configured to exhaust the process chamber;
    a valve body comprising:
        a flow path connecting the process chamber and the vacuum pump; and
        a valve seat provided at the flow path;
    a cylinder connected to the valve body and configured to accommodate a piston movably in a predetermined axial direction;
    a valve element connected to the piston and configured to contact with the valve seat to shut off the flow path or separate from the valve seat according to a valve-opening degree;
    a sensor configured to detect the valve-opening degree; and
    a valve controller configured to control the valve-opening degree,
    wherein the valve controller comprises:
        a first control circuit configured to output a control signal of the valve-opening degree based on a deviation between a pressure of the process chamber and a target vacuum pressure value;
        a second control circuit configured to output an electropneumatic control signal of controlling supply of an operation fluid to the piston based on the control signal of the valve-opening degree; and
        a span adjustment circuit configured to adjust the first control circuit or the second control circuit in a manner that an upper limit value of the valve-opening degree is set to a predetermined opening degree less than a mechanical full opening degree in a forced open mode.

2. The substrate processing apparatus of claim 1, wherein the valve controller further comprises a bias control circuit configured to adjust a lower limit value of the control signal of the valve-opening degree so that the lower limit value corresponds to a leak start position of the valve seat that changes according to the pressure of the process chamber.

3. The substrate processing apparatus of claim 1, wherein the span adjustment circuit adjusts the valve-opening degree using a plurality of control parameters when the valve controller receives a command to be in the forced open mode and generates the control signal of the valve-opening degree corresponding to the predetermined opening degree, and
    the plurality of the control parameters are set so as to compensate for a machine difference based on traces of the pressure of the process chamber at a timing when a predetermined process recipe comprising the command is executed by another substrate processing apparatus.

4. The substrate processing apparatus of claim 1, wherein the second control circuit is further configured to perform a PID (proportional integral derivative) control, and the span adjustment circuit of the valve controller includes an overshoot amount adjustor configured to adjust each parameter of the PID control of the second control circuit or a dead zone of a temporal opening/closing operation valve configured to adjust an air pressure in the cylinder.

5. The substrate processing apparatus of claim 1, further comprising:
    a substrate retainer configured to accommodate a plurality of substrates comprising the substrate with a predetermined interval therebetween along the predetermined axial direction;
    a heat insulating part provided below the substrate retainer;
    a gas supply space fluidically communicable with the process chamber through a plurality of gas supply ports provided to face side ends of the plurality of the substrates; and
    a gas exhaust space fluidically communicable with the process chamber through at least one gas exhaust port provided to face the side ends of the plurality of the substrates,
    wherein the substrate retainer and the heat insulating part are accommodated in a cylindrical space of the process chamber, and the valve body, the cylinder, the valve element, the sensor and the valve controller constitute a vacuum pressure control system.

6. The substrate processing apparatus of claim 1, wherein the span adjustment circuit is further configured to hold a reference gain, and a gain of the control signal of the valve-opening degree is calculated by adjusting the reference gain according to a change in an offset of the control signal of the valve-opening degree.

7. The substrate processing apparatus of claim 1, wherein the sensor comprises a potentiometer configured to detect a lift amount of the valve element, and a gain of the control signal of the valve-opening degree is adjusted so that a valve-opening degree value, which is output by the sensor when an output of the control signal of the valve-opening degree is maximum or a bias is zero, corresponds to the predetermined opening degree.

8. The substrate processing apparatus of claim 1, wherein a gain of the control signal of the valve-opening degree is adjusted so as to approach a predetermined response by (i) measuring a response of the pressure of the process chamber or the valve-opening degree based on an operation pattern and (ii) comparing the response of the pressure of the process chamber with the predetermined response, wherein the operation pattern is same as an operation pattern comprising a constant pressure control and a full opening degree control in a film-forming process of the substrate.

9. The substrate processing apparatus of claim 2, further comprising:
    a sealing force applying part configured to constantly press the valve element toward the valve seat in opposite direction to the pressure of the process chamber;
    wherein while the first control circuit is minimizing the valve-opening degree, the bias control circuit performs comparing a sum of the pressure of the process chamber and a pressure of the cylinder with a reference pressure, and integrating an error of a compared result into a bias value that defines the lower limit value of the control signal of the valve-opening degree.

* * * * *